United States Patent
Shima

(10) Patent No.: US 11,107,788 B2
(45) Date of Patent: Aug. 31, 2021

(54) METHOD OF MANUFACTURING SEMICONDUCTOR DEVICE

(71) Applicant: TOSHIBA MEMORY CORPORATION, Tokyo (JP)

(72) Inventor: Masaya Shima, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 183 days.

(21) Appl. No.: 16/553,789

(22) Filed: Aug. 28, 2019

(65) Prior Publication Data
US 2020/0258858 A1 Aug. 13, 2020

(30) Foreign Application Priority Data

Feb. 13, 2019 (JP) .............................. JP2019-023766

(51) Int. Cl.
*H01L 23/00* (2006.01)
*H01L 25/00* (2006.01)

(52) U.S. Cl.
CPC .............. *H01L 24/27* (2013.01); *H01L 24/03* (2013.01); *H01L 24/09* (2013.01); *H01L 24/11* (2013.01); *H01L 24/16* (2013.01); *H01L 24/32* (2013.01); *H01L 25/50* (2013.01); *H01L 2224/02331* (2013.01)

(58) Field of Classification Search
None
See application file for complete search history.

(56) References Cited

U.S. PATENT DOCUMENTS

| 6,888,209 B2 | 5/2005 | Jobetto |
| 2004/0056340 A1* | 3/2004 | Jobetto ............... H01L 31/0203 257/678 |
| 2015/0200166 A1 | 7/2015 | Kono et al. |
| 2020/0258858 A1* | 8/2020 | Shima ................... H01L 24/03 |

FOREIGN PATENT DOCUMENTS

| JP | 2011-151289 A | 8/2011 |
| JP | 2013-258238 A | 12/2013 |

* cited by examiner

*Primary Examiner* — Jack S Chen
(74) *Attorney, Agent, or Firm* — Foley & Lardner LLP

(57) ABSTRACT

According to one embodiment, a method of manufacturing a semiconductor device includes: forming a semiconductor feature on a first surface of a substrate; forming a first insulating film on the semiconductor feature; forming a first wiring layer on the first insulating film; forming a second insulating film on the first wiring layer; forming a second wiring layer on the second insulating film; forming a first electrode on the second wiring layer; providing a protective adhesive that covers the first electrode and the second wiring layer; bonding a supporting substrate onto the protective adhesive; polishing a second surface of the substrate opposite to the first surface; removing the supporting substrate from the protective adhesive; and removing at least a portion of the protective adhesive to expose the first electrode.

14 Claims, 4 Drawing Sheets

METHOD OF MANUFACTURING SEMICONDUCTOR DEVICE

CROSS-REFERENCE TO RELATED APPLICATION(S)

This application is based upon and claims the benefit of priority from Japanese Patent Application No. 2019-023766, filed Feb. 13, 2019, the entire contents of which are incorporated herein by reference.

FIELD

An embodiment described herein relates generally to a method of manufacturing a semiconductor device.

BACKGROUND

In a semiconductor chip having a multi-layer redistribution layer (RDL) structure, unevenness is generated on a surface of the RDL structure due to the wiring density difference. If the unevenness on the surface becomes large, when the semiconductor chip is stacked on another semiconductor chip, a resin film or resin paste cannot fill a gap between the semiconductor chips, and voids are easily generated. This reduces the reliability and yield of a semiconductor package.

Examples of related art include US-A-2015/0200166, U.S. Pat. No. 6,888,209, Japanese Patent No. 5949193, and JP-A-2011-151289.

DETAILED DESCRIPTION

Figure 1A:
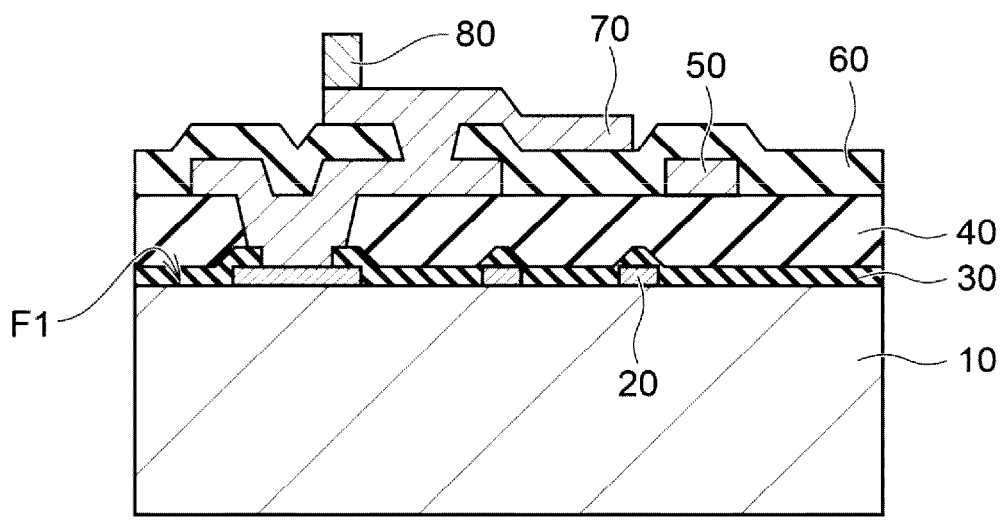
FIGS. 1A and 1B are cross-sectional views showing an example of a method of manufacturing a semiconductor device according to an embodiment.

Embodiments provide a method of manufacturing a highly reliable semiconductor device capable of sufficiently filling a resin between semiconductor chips.

In general, according to one embodiment, a method of manufacturing a semiconductor device includes: forming a semiconductor feature on a first surface of a substrate; forming a first insulating film on the semiconductor feature; forming a first wiring layer on the first insulating film; forming a second insulating film on the first wiring layer; forming a second wiring layer on the second insulating film; forming a first electrode on the second wiring layer; providing a protective adhesive that covers the first electrode and the second wiring layer; bonding a supporting substrate onto the protective adhesive; polishing a second surface of the substrate opposite to the first surface; removing the supporting substrate from the protective adhesive; and removing at least a portion of the protective adhesive to expose the first electrode.

An embodiment of the present disclosure will be described below with reference to the accompanying drawings. The embodiment does not limit the present disclosure. In the following embodiment, the vertical direction of a semiconductor substrate indicates the relative direction when a surface on which a semiconductor element is provided is assumed to be upward, and may be different from the vertical direction according to the gravitational acceleration. The drawings are schematic or conceptual, and the ratio of respective parts does not always represent the actual one. In the specification and drawings, the same reference numerals are assigned to the same elements as those already described with reference to previous drawings, and detailed description thereof may be omitted as appropriate.

Method of Manufacturing Semiconductor Device

FIGS. 1A, 1B, 2A, 2B, 3A, 3B, and 4 are cross-sectional views showing an example of a method of manufacturing a semiconductor device according to the embodiment. First, a semiconductor element (or semiconductor feature) is formed on a first surface F1 of a semiconductor substrate 10. The semiconductor substrate may be, for example, a silicon substrate. The semiconductor element may be, for example, a memory cell array, a transistor, a diode, a resistance element or a capacitor. The semiconductor device may be, for example, a semiconductor chip such as a NAND-type flash memory, or a semiconductor package in which a plurality of semiconductor chips are flip-chip connected.

Next, wirings 20 are formed on the semiconductor substrate 10 and the semiconductor element. Each wiring 20 is electrically connected to at least a part of the semiconductor element through a contact plug, not shown. The wiring 20 is formed of, for example, a conductive metal such as aluminum.

Next, a passivation film 30 is formed on the wiring 20. For example, an insulating material such as $SiO_2$ is used for the passivation film 30. Next, the passivation film 30 is processed using lithography technology and etching technology to expose a part of the surface of the wiring 20.

Next, an interlayer insulating film 40 as a first insulating film covering the wiring 20 and the passivation film 30 is formed above the semiconductor element. For example, an insulating film such as a polyimide is used for the interlayer insulating film 40. Next, the interlayer insulating film 40 is processed using lithography technology and etching technology. Thereby, a part of the surface of the wiring 20 is exposed. When the interlayer insulating film 40 is made of a photosensitive polyimide, a photoresist may not be used in the corresponding lithography process.

Next, a first wiring layer 50 is formed on the interlayer insulating film 40. The first wiring layer 50 is a so-called RDL (Redistribution Layer). For example, a conductive metal such as aluminum, copper, or tungsten is used for the first wiring layer 50. Next, the first wiring layer 50 is processed using lithography technology and etching technology.

Next, an interlayer insulating film 60 as a second insulating film is formed on the first wiring layer 50 and the interlayer insulating film 40. For example, an insulating film such as a polyimide is used for the interlayer insulating film 60. The material of the interlayer insulating film 60 may be the same as the material of the interlayer insulating film 40. Next, the interlayer insulating film 60 is processed using lithography technology and etching technology. Thereby, a part of the surface of the first wiring layer 50 is exposed. When the interlayer insulating film 60 is made of a photosensitive polyimide, a photoresist may not be used in the corresponding lithography process.

Next, a second wiring layer 70 is formed on the interlayer insulating film 60. Similar to the first wiring layer 50, the second wiring layer 70 is an RDL. For example, a conductive metal such as aluminum, copper, or tungsten is used for the second wiring layer 70. The material of the second wiring layer 70 may be the same as the material of the first wiring layer 50. Next, the second wiring layer 70 is processed using lithography technology and etching technology.

Next, a bump 80 as a first electrode is formed on the second wiring layer 70. The material of the bump 80 is deposited on the second wiring layer 70, and the material of the bump 80 is processed using lithography technology and etching technology. Thereby, the bump 80 is formed on the second wiring layer 70. As a material of the bump 80, for example, a conductive metal such as copper, nickel, gold, tin or tungsten is used. As a result, a structure shown in FIG. 1A is obtained.

Figure 1B:
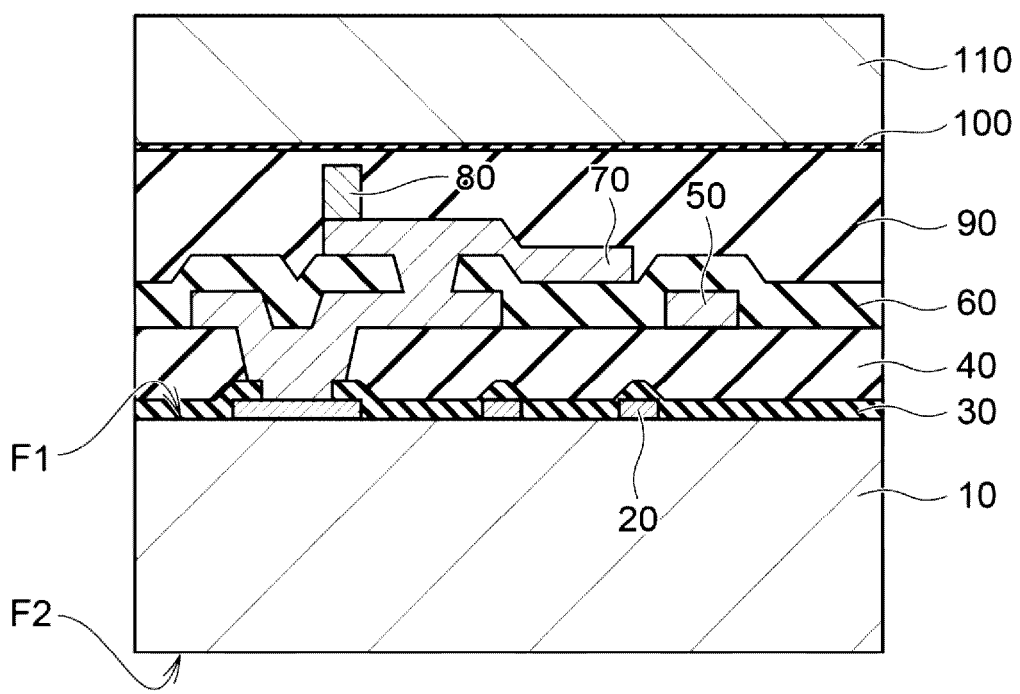

Next, as shown in FIG. 1B, a protective adhesive 90 is applied so as to cover the bump 80, the second wiring layer 70 and the interlayer insulating film 60. The protective adhesive 90 is formed above the upper surface of the bump 80 to embed the entire bump 80. As such, the upper surface of the protective adhesive 90 is above the upper surface of the bump 80. The protective adhesive 90 protects the bump 80, the second wiring layer 70 and the interlayer insulating film 60, and also has a function as an adhesive for bonding the supporting substrate 110. For example, an insulating material such as a polyimide is used for the protective adhesive 90. The protective adhesive 90 need not be processed using lithographic technology. Rather, it is desirable that a non-photosensitive material is used for the protective adhesive 90 because a photosensitive group causes unnecessary gas to be generated. Thus, in the embodiment, it is desirable that the interlayer insulating films 40 and 60 are made of a photosensitive polyimide, and the protective adhesive 90 is made of a polyimide which is not photosensitive.

Here, the protective adhesive 90 is applied by spin or the like, or attached in a sheet form. Thereby, the protective adhesive 90 covers the surfaces of the bump 80, the second wiring layer 70 and the interlayer insulating film 60 having the unevenness in a substantially flat state. Since the surface of the protective adhesive 90 is substantially flat, the supporting substrate 110 can be easily bonded to the protective adhesive 90 without a gap.

Next, a peeling layer 100 is formed on the protective adhesive 90. For example, a flexible resin material such as silicone is used for the peeling layer 100. The peeling layer 100 is provided between the protective adhesive 90 and the supporting substrate 110 in order to facilitate the peeling of the supporting substrate 110 bonded to the protective adhesive 90.

Next, the supporting substrate 110 is attached onto the peeling layer 100. The supporting substrate 110 is made of a rigid material, and may be, for example, a silicon substrate. As a result, a structure shown in FIG. 1B is obtained.

Figure 2A:
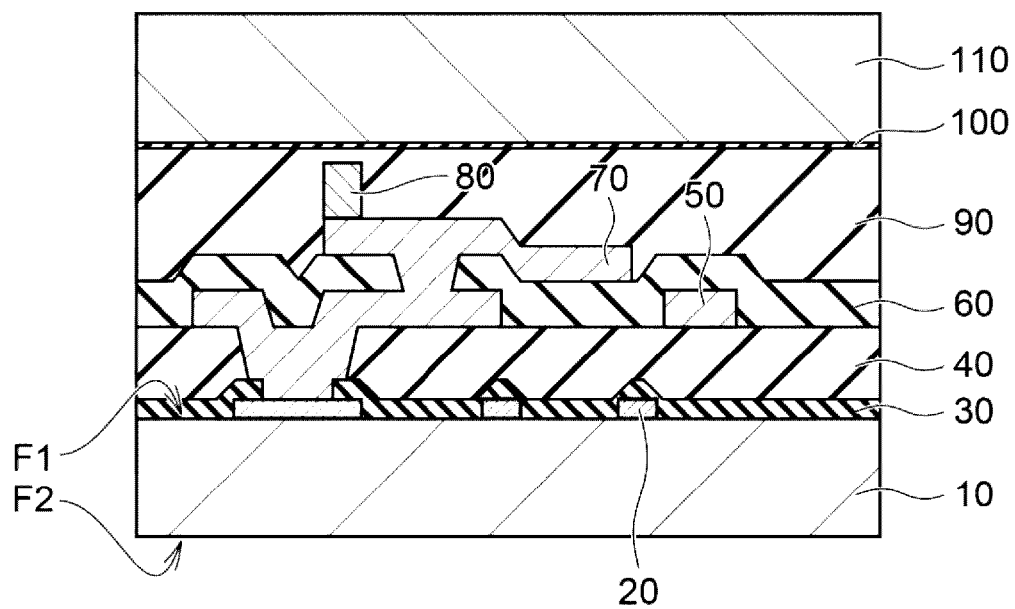
FIGS. 2A and 2B are cross-sectional views showing the method of manufacturing a semiconductor device, continued from FIG. 1.

Next, the supporting substrate 110 is held and rotated to polish a second surface F2 of the semiconductor substrate 10 opposite to the first surface F1. As a result, as shown in FIG. 2A, the semiconductor substrate 10 is thinned.

Figure 2B:
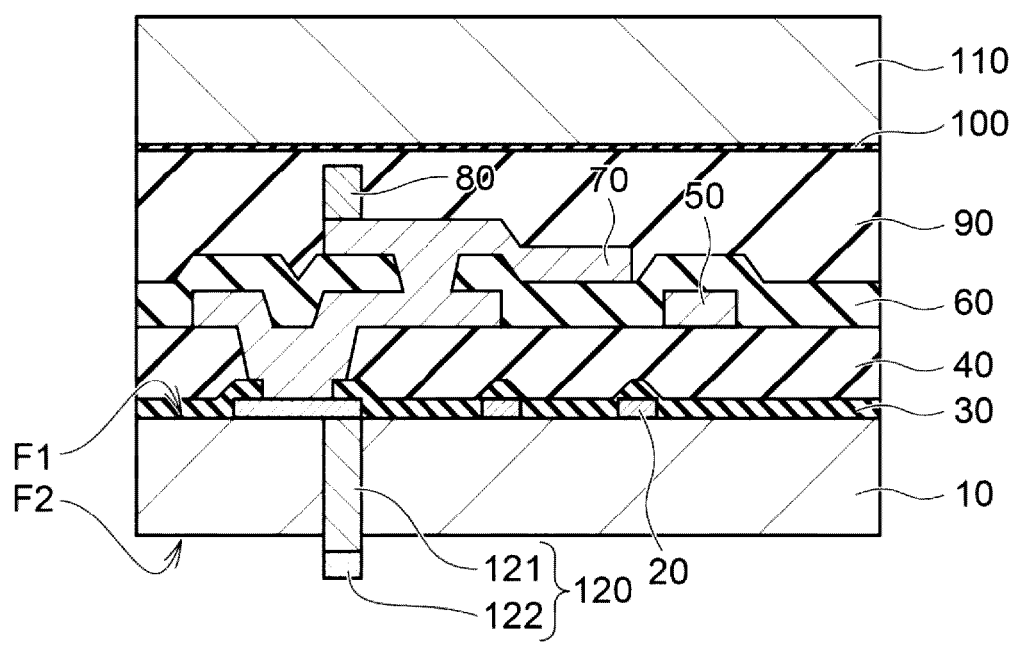

Next, a via is formed penetrating through the semiconductor substrate 10 to at least a part of the semiconductor element, and a conductive metal is embedded in the via. Thereby, as shown in FIG. 2B, a through via (TSV (Through-Silicon Via) 120 as a second electrode connected to at least a part of the semiconductor element is formed. The through via 120 has a through portion 121 and a connection portion 122. For example, copper is used for the through portion 121. For example, solder (Sn) is used for the connection portion 122. It is noted that, in the embodiment, the through via 120 is formed after the thinning of the semiconductor substrate 10. However, the through via 120 may be formed before the thinning of the semiconductor substrate 10. For example, the through via 120 may be formed in the semiconductor substrate 10 before or during the formation of the semiconductor element.

Figure 3A:
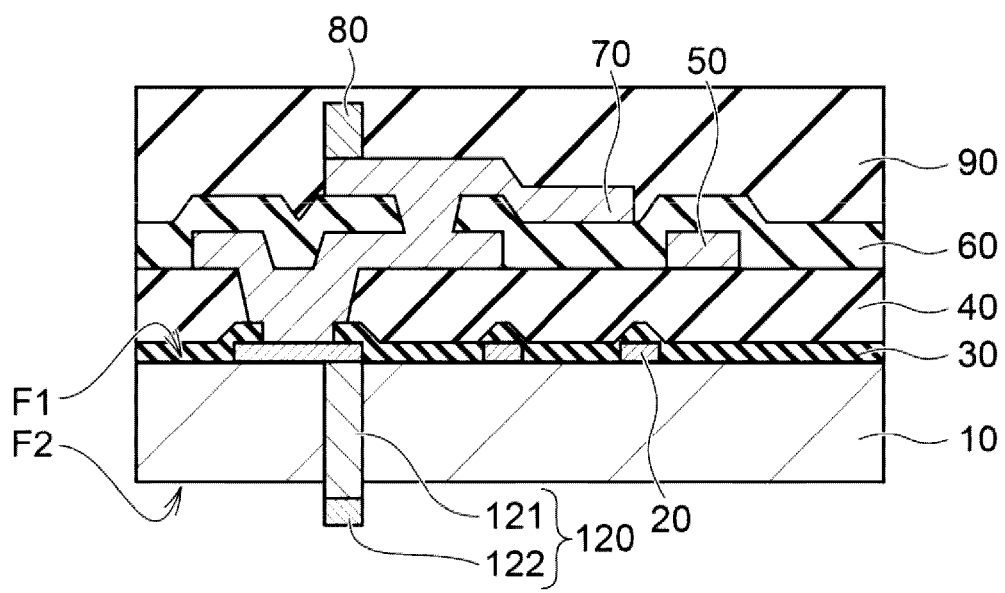
FIGS. 3A and 3B are cross-sectional views showing the method of manufacturing a semiconductor device, continued from FIG. 2.

Next, as shown in FIG. 3A, the supporting substrate 110 is peeled off from the peeling layer 100 and the peeling layer 100 is removed from the protective adhesive 90.

Figure 3B:
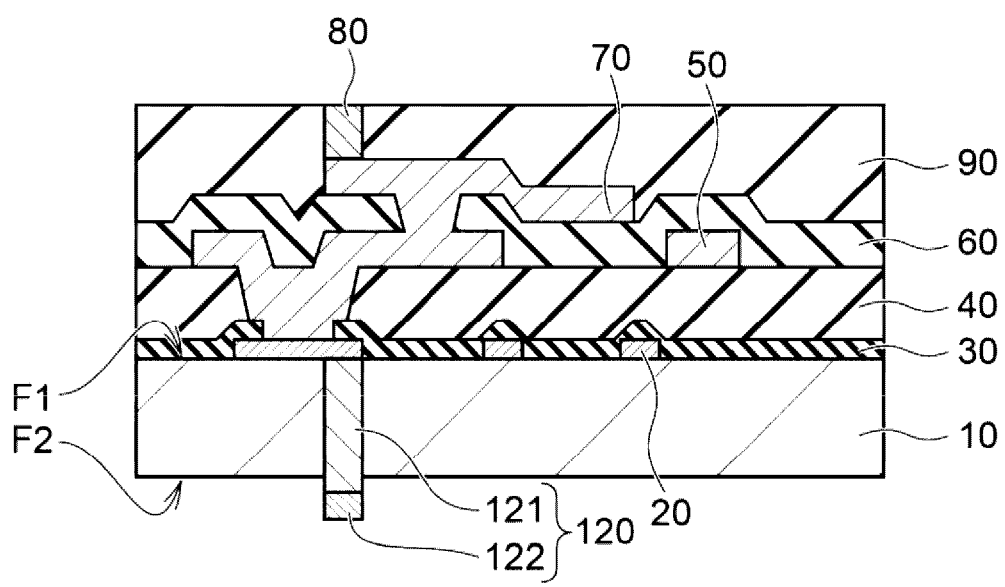

Next, as shown in FIG. 3B, the protective adhesive 90 is ground until the upper surface of the bump 80 is exposed. At this time, the protective adhesive 90 is physically ground (e.g., cut). Thereby, the protective adhesive 90 and the bump 80 become substantially flush. Alternatively, the protective adhesive 90 may be polished by a polishing apparatus or the like. When the protective adhesive 90 is ground and/or polished, the upper portion of the bump 80 may be ground and/or polished simultaneously to make the bump 80 and the protective adhesive 90 substantially flush. The term "flush" is herein referred to as the upper surface of the bump 80 and the protective adhesive 90 forming a substantially flat surface. In some embodiments, the bump 80 and the protective adhesive 90, when being flush, may sometimes be referred to as sharing a coplanar upper surface.

Thereafter, the semiconductor substrate 10 is diced to segment the semiconductor substrate 10 into semiconductor chips. A semiconductor chip is stacked on another semiconductor chip by flip-chip bonding. At that time, the connection portion 122 is connected to a bump 80 of the other semiconductor chip. Thereby, the semiconductor element may be electrically connected to a semiconductor element of the other semiconductor chip. Alternatively, the semiconductor chip may be mounted on a mounting substrate, not shown. In this case, the connection portion 122 is connected to an electrode of the mounting substrate.

Figure 4:
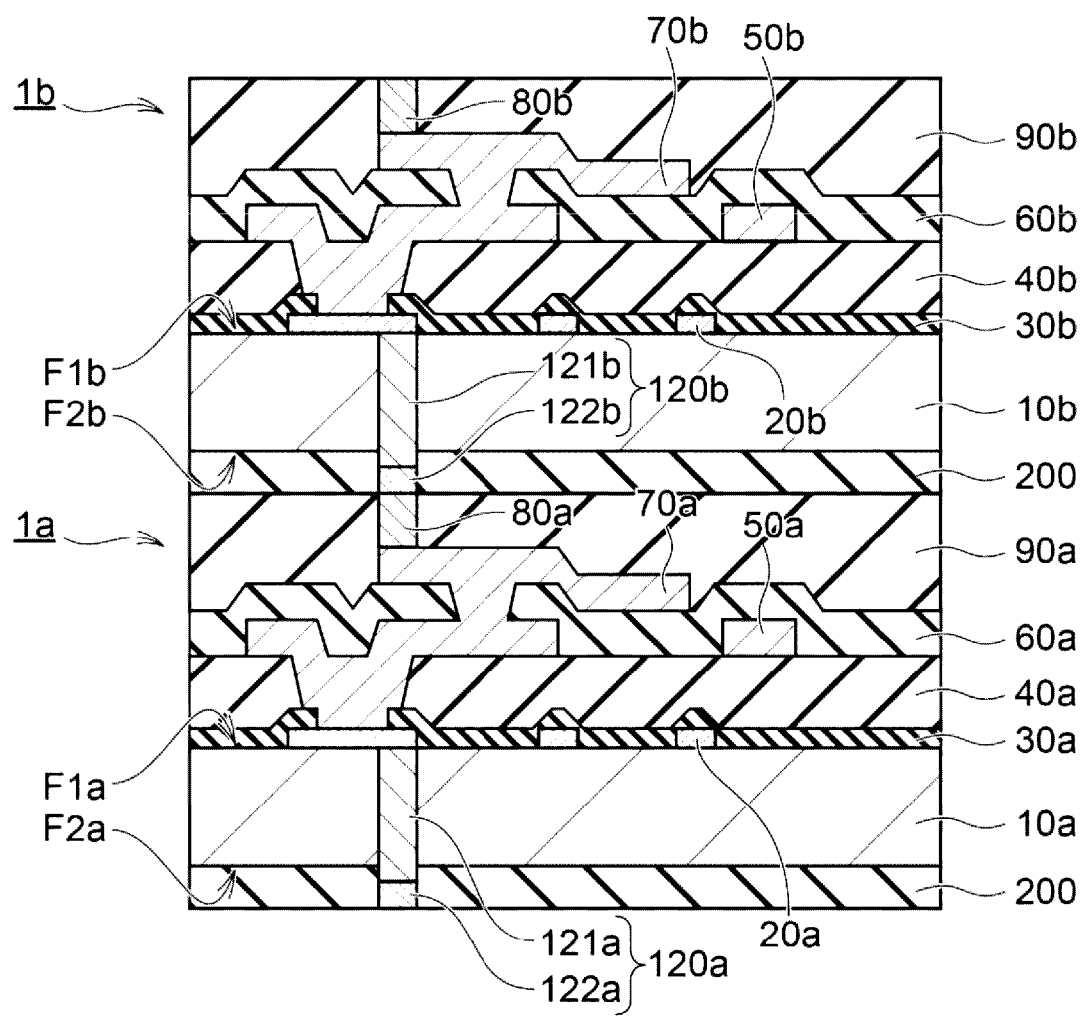
FIG. 4 is a cross-sectional view showing the method of manufacturing a semiconductor device, continued from FIG. 3.

FIG. 4 is a cross-sectional view showing an example of the configuration of a plurality of semiconductor chips flip-chip bonded. In FIG. 4, semiconductor chips 1a and 1b are semiconductor chips manufactured by the manufacturing method according to the embodiment. It is noted that, for the sake of convenience, the components of the semiconductor chip 1a are given "a" after the reference numerals. The components of the semiconductor chip 1b are given "b" after the reference numbers.

The semiconductor chip 1b as a second semiconductor device is stacked on the semiconductor chip 1a as a first semiconductor device. A through via 120b on a second surface F2b side of the semiconductor chip 1b is disposed on a bump 80a on a first surface F1a side of the semiconductor chip 1a. Next, by performing heat treatment, a connection portion 122b of the semiconductor chip 1b is reflowed and connected to the bump 80a of the semiconductor chip 1a.

Next, a resin 200 is filled or attached between the semiconductor chip 1a and the semiconductor chip 1b. The resin 200 is a resin paste or a resin film. The resin 200 is applied or attached to the upper surface of a protective adhesive 90a of the semiconductor chip 1a, and the second surface F2b of the semiconductor substrate 10b of the semiconductor chip 1b is placed thereon. Alternatively, the resin 200 is applied or attached to the second surface F2b of the semiconductor chip 1b, and the upper surface of the protective adhesive 90a of the semiconductor chip 1b is placed thereunder. Then, by performing heat treatment, the connection portion 122b of the through via 120b is connected to the bump 80a, and the resin 200 is filled between the semiconductor chips 1a and 1b.

When the semiconductor chips 1a and 1b are further provided on another semiconductor chip, the resin 200 is also filled between the semiconductor chips.

Furthermore, the plurality of semiconductor chips flip-chip connected are covered with a sealing resin, not shown. As a result, a plurality of semiconductor chips are protected, and a semiconductor package is completed.

According to the embodiment, the protective adhesive 90 covers and protects the bump 80, the second wiring layer 70 and the interlayer insulating film 60, and also has a function as an adhesive for bonding the supporting substrate 110. Therefore, it is not necessary to provide an adhesive separately from the interlayer insulating film that protects the second wiring layer 70 and the interlayer insulating film 60.

Usually, in the case of having a plurality of redistribution layers (RDLs), the unevenness of the surface of the uppermost interlayer insulating film is enlarged by wirings thereunder, and an adhesive is applied to fill the unevenness. The supporting substrate 110 can be attached to the semiconductor substrate 10 by the adhesive. However, in this case, an adhesive is required in addition to the interlayer insulating film.

On the other hand, according to the embodiment, the protective adhesive 90 also serves as the adhesive of the uppermost interlayer insulating film and the supporting substrate 110. Therefore, it is not necessary to provide an adhesive separately from the protective adhesive 90. The protective adhesive 90 is ground so as to expose the surface of the bump 80 after covering the bump 80, the second wiring layer 70 and the interlayer insulating film 60. Thereby, the surface of the protective adhesive 90 is planarized. The substantially flat surface of the protective adhesive 90 facilitates the attachment and peeling of the supporting substrate 110. In addition, since the surface of the protective adhesive 90 is substantially flat after the peeling of the supporting substrate 110, when another semiconductor chip is flip-chip connected, the resin 200 can be filled between the semiconductor chips without voids. That is, according to the embodiment, the flip-chip connection between a plurality of semiconductor chips can be facilitated, and the generation of voids between semiconductor chips can be prevented.

In addition, the protective adhesive 90 does not have to be patterned and is only ground as a whole. Thus, the protective adhesive 90 may be made of a non-photosensitive insulating material. Rather, the photosensitive group causes unnecessary gas to be generated during heat treatment. On the other hand, the protective adhesive 90 having no photosensitive group can prevent the generation of unnecessary gas during heat treatment.

Further, the melting point of the through portion 121 of the through via 120 and the bump 80 (for example, copper) is lower than the melting point of the connection portion 122 (for example, solder) of the through via 120. Therefore, as shown in FIG. 4, the plurality of semiconductor chips 1a and 1b are stacked and heat treated to melt the connection portion 122 without melting the through portion 121 and the bump 80, so that the connection portion 122 can be connected to the bump 80. When a plurality of through vias 120 and a plurality of bumps 80 are provided on the semiconductor chip, a plurality of connection portions 122 can be connected to the corresponding plurality of bumps 80 by one heat treatment. Thereby, a plurality of semiconductor chips can be flip-chip connected.

Configuration of Semiconductor Device

As shown in FIG. 3B, the semiconductor device manufactured according to the embodiment includes the semiconductor substrate 10, the wirings 20, the passivation film 30, the interlayer insulating films 40 and 60, the first wiring layer 50, the second wiring layer 70, the bump 80, the protective adhesive 90, and the through via 120.

Each wiring 20 is provided on the first surface F1 of the semiconductor substrate 10. The passivation film 30 covers the wiring 20. The interlayer insulating film 40 is provided on the passivation film 30. A part of the surface of wiring 20 is exposed from the passivation film 30 and the interlayer insulating film 40. The first wiring layer 50 is provided on the interlayer insulating film 40 and connected to the exposed portion of the wiring 20.

The second interlayer insulating film 60 is provided on the first wiring layer 50, and exposes a part of the first wiring layer 50. The second wiring layer 70 is provided on the interlayer insulating film 60 and connected to the exposed portion of the first wiring layer 50. The first and second wiring layers 50 and 70 are provided as redistribution layers (RDLs). In this manner, the embodiment has a multi-layer redistribution layer structure including a plurality of redistribution layers.

The bump 80 is provided on the second wiring layer 70. The protective adhesive 90 is provided around the bump 80 so as to cover the second wiring layer 70 and the interlayer insulating film 60. The protective adhesive 90 exposes the upper surface of the bump 80 while covering the second wiring layer 70 and the interlayer insulating film 60. In addition, the protective adhesive 90 can provide a substantially flat surface to the semiconductor device by absorbing the unevenness of the wiring layers 50 and 70 and the interlayer insulating films 40 and 60. As a result, when a plurality of semiconductor chips are flip-chip connected, the resin can be easily filled between the semiconductor chips, and the generation of voids can be prevented between the semiconductor chips.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
   forming a semiconductor feature on a first surface of a substrate;
   forming a first insulating film on the semiconductor feature;
   forming a first wiring layer on the first insulating film;
   forming a second insulating film on the first wiring layer;
   forming a second wiring layer on the second insulating film;
   forming a first electrode on the second wiring layer;

providing a protective adhesive that covers the first electrode and the second wiring layer;
bonding a supporting substrate to the protective adhesive;
polishing a second surface of the substrate opposite to the first surface;
removing the supporting substrate from the protective adhesive; and
removing at least a portion of the protective adhesive to expose the first electrode.

2. The method of manufacturing a semiconductor device according to claim 1, further comprising forming a second electrode penetrating through the substrate to connect the semiconductor feature after polishing the second surface of the substrate.

3. The method according to claim 2, wherein the second electrode includes a through portion that penetrates through the substrate and a connection portion that protrudes the second surface of the substrate.

4. The method according to claim 3, wherein a melting point of the through portion is less than a melting point of the connection portion.

5. The method of manufacturing a semiconductor device according to claim 1, wherein
the first insulating film and the second insulating film are made of an insulating material having photosensitivity, and
the protective adhesive is made of an insulating material having no photosensitivity.

6. The method of manufacturing a semiconductor device according to claim 1, wherein
the first and second insulating films are made of a polyimide having photosensitivity, and
the protective adhesive is made of a polyimide having no photosensitivity.

7. The method of manufacturing a semiconductor device according to claim 1, wherein the step of removing at least a portion of the protective adhesive results in the protective adhesive and the first electrode being substantially flush.

8. The method according to claim 1, wherein removing at least a portion of the protective adhesive comprises:
grinding the protective adhesive.

9. The method according to claim 1, wherein the first wiring layer includes a redistribution layer (RDL).

10. A method of manufacturing a semiconductor package, comprising:
forming each of a plurality of semiconductor devices by:
forming a semiconductor feature on a first surface of a substrate;
forming a first insulating film above the semiconductor feature;
forming a first wiring layer on the first insulating film;
forming a second insulating film on the first wiring layer;
forming a second wiring layer on the second insulating film;
forming a first electrode on the second wiring layer;
providing a protective adhesive that covers the first electrode and the second wiring layer;
bonding a supporting substrate onto the protective adhesive;
polishing a second surface of the substrate opposite to the first surface;
removing the supporting substrate from the protective adhesive; and
removing at least a portion of the protective adhesive to expose the first electrode; and
stacking the plurality of the semiconductor devices.

11. The method according to claim 10, further comprising:
connecting, by a through via, a second electrode of a second one of the plurality of semiconductor devices to the first electrode of a first one of the plurality of semiconductor devices; and
filling a resin between the first semiconductor device and the second semiconductor device.

12. The method according to claim 11, wherein
the first and second insulating films are made of an insulating material having photosensitivity, and
the protective adhesive is made of an insulating material having no photosensitivity.

13. The method according to claim 10, wherein
the first and second insulating films are made of an insulating material having photosensitivity, and
the protective adhesive is made of an insulating material having no photosensitivity.

14. The method according to claim 10, wherein the protective adhesive and the first electrode are substantially flush after removing at least a portion of the protective adhesive.

* * * * *